(12) United States Patent
Takano et al.

(10) Patent No.: US 8,445,938 B2
(45) Date of Patent: May 21, 2013

(54) NITRIDE SEMI-CONDUCTIVE LIGHT EMITTING DEVICE

(75) Inventors: Takayoshi Takano, Kawanishi (JP);
Kenji Tsubaki, Katano (JP); Hideki Hirayama, Asaka (JP); Sachie Fujikawa, Osaka (JP)

(73) Assignee: Panasonic Corporation, Osaka (JP)

( * ) Notice: Subject to any disclaimer, the term of this patent is extended or adjusted under 35 U.S.C. 154(b) by 267 days.

(21) Appl. No.: 12/933,927

(22) PCT Filed: Mar. 23, 2009

(86) PCT No.: PCT/JP2009/055656
§ 371 (c)(1),
(2), (4) Date: Sep. 22, 2010

(87) PCT Pub. No.: WO2009/119498
PCT Pub. Date: Oct. 1, 2009

(65) Prior Publication Data
US 2011/0042713 A1    Feb. 24, 2011

(30) Foreign Application Priority Data

Mar. 26, 2008 (JP) .................. 2008-079786
Jun. 27, 2008 (JP) .................. 2008-168516

(51) Int. Cl.
*H01L 33/00* (2010.01)

(52) U.S. Cl.
USPC ............. 257/101; 257/E33.033; 438/46

(58) Field of Classification Search
None
See application file for complete search history.

(56) References Cited

U.S. PATENT DOCUMENTS 5,324,684 A * 6/1994 Kermani et al. .......... 438/566
5,777,350 A    7/1998 Nakamura et al.
(Continued)

FOREIGN PATENT DOCUMENTS

| JP | 9-36430 A | 2/1997 |
|---|---|---|
| JP | 9-148678 A | 6/1997 |

(Continued)

OTHER PUBLICATIONS

International Search Report for the Application No. PCT/JP2009/055656 mailed Apr. 14, 2009.

*Primary Examiner* — Michael Lebentritt
*Assistant Examiner* — Kevin Quinto
(74) *Attorney, Agent, or Firm* — McDermott Will & Emery LLP

(57) ABSTRACT

The nitride semi-conductive light emitting layer in this invention comprises a single crystal substrate 1 for epitaxial growth, a first buffer layer 2, an n-type nitride semi-conductive layer 3, a second buffer layer 4, a third buffer layer 5, a light emitting layer 6, and a p-type nitride semi-conductive layer 7. The first buffer layer 2 is laminated to a top side of the single crystal substrate 1. The n-type nitride semi-conductive layer 3 is laminated to a top side of the first buffer layer 2. The third buffer layer 5 is laminated to a top side of the n-type nitride semi-conductive layer 3 with the second buffer layer 4 being interposed therebetween. The light emitting layer 6 is laminated to a top side of the third buffer layer 5. The p-type nitride semi-conductive layer 7 is laminated to a top side of the light emitting layer 6. The third buffer layer 5 serves as a planarized base for growth of the light emitting layer 6 so as to reduce a threading dislocation and a residual distortion in the light emitting layer 6. This nitride semi-conductive light emitting device reduces a piezoelectric field in the light emitting layer by exploiting carriers generated in the third buffer layer 5. The third buffer layer 5 is doped with an Si impurity serving as a donor.

14 Claims, 12 Drawing Sheets

U.S. PATENT DOCUMENTS

| | | | |
|---|---|---|---|
| 5,959,307 A | 9/1999 | Nakamura et al. | |
| 6,023,077 A | 2/2000 | Iyechika et al. | |
| 6,580,099 B2 | 6/2003 | Nakamura et al. | |
| 6,838,705 B1 * | 1/2005 | Tanizawa | 257/101 |
| 2001/0030318 A1 | 10/2001 | Nakamura et al. | |
| 2003/0015724 A1 | 1/2003 | Nakamura et al. | |
| 2003/0062531 A1 * | 4/2003 | Furukawa et al. | 257/79 |
| 2004/0101012 A1 | 5/2004 | Nakamura et al. | |
| 2004/0183063 A1 | 9/2004 | Nakamura et al. | |
| 2005/0035360 A1 | 2/2005 | Tanizawa | |
| 2005/0104081 A1 * | 5/2005 | Kim et al. | 257/99 |
| 2005/0145860 A1 | 7/2005 | Tanizawa | |
| 2006/0097242 A1 * | 5/2006 | Kuramoto | 257/13 |
| 2007/0272915 A1 | 11/2007 | Nakamura et al. | |
| 2009/0001409 A1 | 1/2009 | Takano et al. | |

FOREIGN PATENT DOCUMENTS

| | | |
|---|---|---|
| JP | 9-321339 A | 12/1997 |
| JP | 2001-148507 A | 5/2001 |
| JP | 2007-73630 A | 3/2007 |

* cited by examiner

NITRIDE SEMI-CONDUCTIVE LIGHT EMITTING DEVICE

TECHNICAL FIELD

The present invention relates to nitride semi-conductive light emitting devices.

BACKGROUND ART

Nitride semi-conductive light emitting device is compact and configured to emit a light in UV-visible region with low electrical consumption, and have been widely studied for hygienic, medical, and industrial applications as well as development of illumination devices, precision machines, and the like. The nitride semi-conductive light emitting device has already been developed for practical use, in particular regions such as blue-color region.

As well as the nitride semi-conductive light emitting device emitting blue-color light (which is referred to as a blue-color light emitting diode, hereafter), the nitride semi-conductive light emitting device needs to have a further improved luminescence efficiency and light output. In particular, the semi-conductive light emitting device emitting a light in ultraviolet region (which is referred to as an ultraviolet light emitting diode (UV-LED), hereafter) provides a significantly lower light extraction efficiency and significantly smaller light output than the blue-color light emitting diode. The significantly small light extraction efficiency and light output have been obstacles to practical use of the light emitting diode in UV region. The significantly small light extraction efficiency and light output are presumably attributed to very low light emission efficiency (referred to as internal quantum efficiency, hereafter) in the light emitting layer. The internal quantum efficiency of the light emitting layer made of nitride semi-conductive material (nitride mixed crystal) is caused to be significantly lowered by transition, point defect, or the like which are highly formed in the light emitting layer. Especially, light emitting layer made of an AlGaN ternary mixed crystal including Al exhibits a considerably lowered internal quantum efficiency, for difficulty in growth of the crystal with high quality. AlGaInN quaternary mixed crystal obtained by an addition of In to AlGaN has been attracted as a mixed crystal less susceptible to the transition and the point defect, for application to the material of the light emitting layer. InAlGaN gives an improved internal quantum efficiency of the light emitting layer of the UV-LED, and has been studied for achieving practical use of the UV-LED. However, the UV-LED still gives too low internal quantum efficiency of the light emitting layer, and needs to be improved for achieving high external quantum efficiency of several tens of percent.

Japanese unexamined patent application publication No. 2007-73630 discloses a UV-light emitting diode comprising a single crystal substrate for epitaxial growth, an n-type nitride semi-conductive layer laminated to top side of the single crystal substrate with a first buffer layer interposed therebetween, a light emitting layer laminated to top side of the n-type nitride semi-conductive layer, and a p-type nitride semi-conductive layer laminated to top side of the light emitting layer. This UV-light emitting diode in Japanese unexamined patent application publication No. 2007-73630 comprises the light emitting layer having an AlGaInN quantum well structure, and a second buffer layer having the same composition as a barrier layer of the light emitting layer. The second buffer layer is provided between the n-type nitride semi-conductive layer and the light emitting layer. As being provided with the second buffer layer, the light emitting diode is found to give a high output of UV-light, compared to the light emitting diode not having the second buffer layer.

The nitride semi-conductive light emitting device such as this UV-light emitting diode in Japanese unexamined patent application publication No. 2007-73630 has a laminated structure, in which the second buffer layer is provided for suppressing the distortion of the light emitting layer resulting from the difference in lattice constant between the n-type nitride semi-conductive layer and the light emitting layer. However, this nitride semi-conductive light emitting device still fails to eliminate the problem related to an electric field caused by piezo effect (which is referred to as "piezoelectric field, hereafter) due to the difference in lattice constant between the well layer and the barrier layer which are formed of AlGaInN layers having different compositions. The piezoelectric field spatially separates each hole from each electron injected into the light emitting layer such that electron-accumulated portion is deviated from hole-accumulated portion in the thickness direction of the light emitting layer. It leads to decrease of probability in electron-hole recombination as well as decrease of the internal quantum efficiency of the light emitting layer, thereby causing reduction of the external quantum efficiency. This nitride semi-conductive light emitting device still has a poor planarity of a base for growth of the light emitting layer, although provided with the second buffer layer, thereby making it difficult to form a light emitting layer with a high quality.

DISCLOSURE OF THE INVENTION

This invention has been accomplished in view of the above problem, and has an object to provide a nitride semi-conductive light emitting layer with an improved internal quantum efficiency of a light emitting layer to give a further improved output.

The nitride semi-conductive light emitting layer in this invention comprises a single crystal substrate, a first buffer layer, an n-type nitride semi-conductive layer, a second buffer layer, a light emitting layer, and a p-type nitride semi-conductive layer. The first buffer layer is laminated to a top side of the single crystal substrate. The n-type nitride semi-conductive layer is laminated to a top side of the first buffer layer. The second buffer layer is laminated to a top side of the n-type nitride semi-conductive layer. The light emitting layer is laminated to a top side of the second buffer layer. The p-type nitride semi-conductive layer is laminated to a top side of the light emitting layer. The nitride semi-conductive light emitting device further comprises a third buffer layer. The third buffer layer is provided between the second buffer layer and the light emitting layer, and doped with an impurity serving as a donor.

As provided with the third buffer layer which is doped with the impurity serving as the donor and provided between the second buffer layer and the light emitting layer, the nitride semi-conductive light emitting device in this invention enables it to reduce a threading dislocation and a residual distortion in the light emitting layer. This nitride semi-conductive light emitting device improves a crystallinity of the light emitting layer, as well as suppressing a piezoelectric field in the light emitting layer by exploiting carriers generated in the third buffer layer, for improving an internal quantum efficiency and light output. Besides, the nitride semi-conductive light emitting device in the present invention enables it to supply the light emitting layer with electrons while maintaining high conductivity with the help of the impurity which is doped in the third buffer layer for serving as a donor, improving the internal quantum efficiency of the light emitting layer for achieving a high output.

The impurity doped in the third buffer layer is preferably Si. Since Si is doped in the third buffer layer, the nitride semi-conductive light emitting device enables it to improve the planarity of a surface of the third buffer layer, improving a quality of the light emitting layer as well as the internal quantum efficiency of the light emitting layer. When the n-type nitride semi-conductive layer is doped with Si impurity as a donor, this nitride semi-conductive light emitting device does not necessitate an additional source of Si serving as a donor in the third buffer layer, and transfer tubes for transferring the source of Si, thereby simplifying the fabrication device as well as reducing fabrication cost.

The third buffer layer is preferably arranged to have the same components as the second buffer layer. This arrangement enables the third buffer layer to be grown at the same temperature as in growth of the second buffer layer, thereby the third buffer layer is allowed to be grown consecutively after the growth of second buffer layer is completed, without causing a long interruption. Accordingly, this arrangement enables it to improve a quality of interface between the second buffer layer and the third buffer layer, achieving a reduced fabrication time for the light emitting device.

The third buffer layer is preferably arranged to have a band-gap energy larger than a photon energy of light emitted from the light emitting layer. This arrangement allows the light emitted from the light emitting layer to be efficiently directed outward without being absorbed in the third buffer layer.

The third buffer layer is preferably arranged to have a thickness larger than the second buffer layer. This arrangement enables it to improve a planarity of the third buffer layer serving as a base for growth of the light emitting layer.

The third buffer layer is preferably arranged to have a concentration of the donor lower than the n-type nitride semi-conductive layer. This arrangement enables it to decrease crystalline defects in the third buffer layer serving as the base for growth of the light emitting layer and improve the internal quantum efficiency of the light emitting layer.

In a preferred configuration, the light emitting layer has a quantum-well structure containing a barrier layer which is doped with an impurity serving as a donor. In this configuration, the light emitting layer has the quantum-well structure in which the barrier layer is disposed adjacent to a well layer and doped with the impurity serving as the donor. It enables to efficiently suppress a piezoelectric field generated in the quantum-well structure of the light emitting layer, by exploiting carriers generated in the barrier layer.

BEST MODE FOR CARRYING OUT THE INVENTION

First Embodiment

Figure 1:
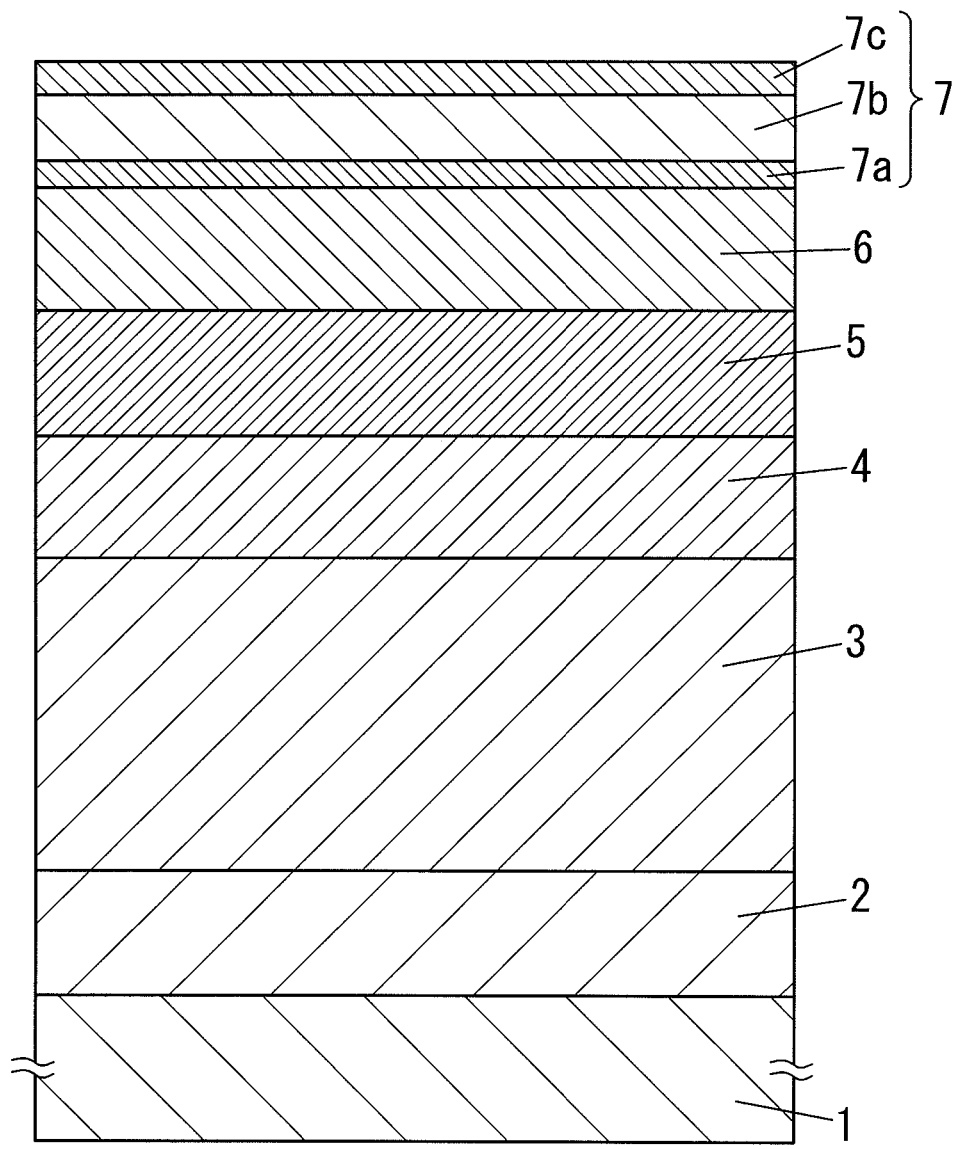
FIG. 1 shows a schematic sectional view of a nitride semi-conductive light emitting device in accordance with first embodiment.

In this embodiment, a nitride semi-conductive light emitting device is a UV-light emitting diode. As shown in FIG. 1, the nitride semi-conductive light emitting device includes a single crystal substrate/for epitaxial growth, a first buffer layer 2, an n-type nitride semi-conductive layer 3, a second buffer layer 4, a third buffer layer 5, a light emitting layer 6, a p-type nitride semi-conductive layer 7. The first buffer layer 2 is formed on a top face of the single crystal substrate 1. The n-type nitride semi-conductive layer 3 is formed on a top face of the first buffer layer 2. The third buffer layer 5 is laminated to top face of the n-type nitride semi-conductive layer 3 with the second buffer layer 4 being interposed therebetween. The light emitting layer 6 is formed on a top face of the third buffer layer 5. The p-type nitride semi-conductive layer 7 is formed on a top face of the light emitting layer 6. The n-type nitride semi-conductive 3 and the p-type nitride semi-conductive layer 7 are formed with a cathode (not shown) and an anode (not shown), respectively.

The single crystal substrate 1 is formed of a sapphire substrate having a (0001) face, i.e. c-face, at its top.

The first buffer layer 2 is formed of a single crystal of AlN layer having a thickness of 2.2 μm, for suppressing a threading dislocation and a residual distortion of the n-type nitride semi-conductive layer 3. The first buffer layer 2 may be formed to have a thickness except 2.2 μm.

Prior to formation of the first buffer layer 2, the single crystal substrate 1 made of sapphire substrate is put into a reaction chamber of MOVPE apparatus. Then, the single crystal substrate is heated up to a predetermined temperature (e.g., 1250° C.) and retained at the temperature for a predetermined time (e.g., 10 minutes) under a predetermined pressure (e.g., 10 kPa≈76 Torr), so as to be cleaned at its top surface. Next, the reaction chamber is supplied with trimethylaluminum (TMAl) as a source of Al and $NH_3$ as a source of nitrogen simultaneously, while the substrate is retained at the predetermined temperature (1250° C. in this embodiment), in order to grow the first buffer layer 2 made of a single crystalline AlN layer. At this time, both of supply rates of TMAl and $NH_3$ are set to be 0.05 L/min (50SCCM) under standard state. The first buffer layer 2 may be made of a single crystalline AlGaN layer, instead of the single crystalline AlN layer.

The n-type nitride semi-conductive layer 3 is formed of an Si-doped n-type $Al_{0.55}Ga_{0.45}N$ layer on the first buffer layer 2. The n-type nitride semi-conductive layer 3 is set to have a thickness of 2 μm in this embodiment, but the present invention is not limited to this thickness. The n-type nitride semi-conductive layer 3 may be formed of a multilayer structure instead of a single layer structure. For instance, the n-type nitride semi-conductive layer 3 may be composed of an Si-doped n-type $Al_{0.7}Ga_{0.3}N$ layer formed on the first buffer layer 2, and an Si-doped n-type $Al_{0.55}Ga_{0.45}N$ layer formed on the Si-doped n-type $Al_{0.7}Ga_{0.3}N$ layer.

The n-type nitride semi-conductive layer 3 is grown at a temperature of 1100° C. under a pressure of 10 kPa. TMAl, trimethylgallium (TMGa), $NH_3$, and tetraethylsilane (TESi) are employed respectively as sources of Al, Ga, N, and Si for growth of the n-type nitride semi-conductive layer 3. Si serves as an impurity for giving n-type electrical property. $H_2$ and $N_2$ gases are utilized as carrier gases for carrying these sources. The supply rate of TESi is set to be 0.0009 L/min (0.9 SCCM) under standard state. Other sources can be employed for growth of the n-type nitride semi-conductive layer in the present invention, instead of the above materials. For example, triethylgallium (TEGa), a hydrazine derivative, and monosilane ($SiH_4$) can be employed respectively as sources of Ga, N, and Si.

The second buffer layer 4 is provided for suppressing a threading dislocation and a residual distortion of the light emitting layer 6, and formed of an AlGaInN layer having a thickness of 3 nm. Herein, the second buffer layer 4 is suitably designed to have a specific composition for having such a band-gap energy not to absorb therein a light emitted form the light emitting layer 6. This bandgap energy is set to be 4.7 eV in this embodiment. The second buffer layer is not required to have the above bandgap energy, unless absorbing therein the light emitted from the light emitting layer 6. The thickness of the second buffer layer 4 is set to be 3 nm in this embodiment, but may be other in the present invention.

The second buffer layer 4 is grown at a temperature of 800° C. under a pressure of 10 kPa. TMAl, TMGa, trimethylindium (TMIn), and $NH_3$ are employed respectively as sources of Al, Ga, In and N for growth of the second buffer layer. $N_2$ gas is utilized as a carrier gas for carrying these sources.

The third buffer layer 5 is provided for suppressing the threading dislocation and the residual distortion of the light emitting layer 6 as well as serving as a planarized base for growth of the bottom of the light emitting layer 6. The third buffer layer 5 serves to suppress a piezoelectric field of the light emitting layer 6 by exploiting carriers generated in the third buffer layer 5, and is formed of an n-type AlGaInN layer having a thickness of 20 nm which is doped with Si impurity as a donor. Namely, the third buffer layer 5 has the same components as the second buffer layer 4. The composition of the third buffer layer 5 is suitably set to have a large band-gap energy, for not allowing the light emitted from the light emitting layer 6 to be absorbed in the third buffer layer 5. The third buffer layer 5 has the same composition as the second buffer layer 4 in this embodiment. The third buffer layer 5 may be formed to have a thickness except 20 nm.

The third buffer layer 5 is grown at a temperature of 800° C. under a pressure of 10 kPa. TMAl, TMGa, trimethylindium (TMIn), $NH_3$ and TESi are employed respectively as sources of Al, Ga, In, N and Si for growth of the third buffer layer 5. $N_2$ gas is employed as a carrier gas for carrying these sources. Namely, the third buffer layer 5 and the second buffer layer 4 are grown in almost the same way, but TESi as a source gas is additionally supplied for growth of the third buffer layer 5. In this embodiment, the supply rate of TESi is set to be 0.0009 L/min (0.9 SCCM) under standard state.

The light emitting layer 6 has an AlGaInN quantum well structure composed of barrier layers and well layers, in which each barrier layer is formed of an Si-doped n-type AlGaInN layer having a thickness of 5 nm and each well layer is formed of an AlGaInN layer having a thickness of 1.7 nm. The light emitting layer 6 is formed of a multi-quantum well structure in this embodiment, but may be formed of a single quantum well structure. The barrier layer is designed to have a composition for having the same band-gap energy of 4.7 eV as the third buffer layer, whereas the well layer is designed to have a composition for having a band-gap energy of 4.4 eV. The light emitting layer 6 has a multi-quantum well structure having three well layers in which each well layer and each barrier layer are alternately superimposed on each other. The compositions of the well layer and the barrier layer are not limited to the above values, and can be respectively determined depending on a desired wavelength of luminescence. The number of well layer is not particularly limited, but may be one. In this case, the light emitting layer may be a single quantum-well layer structure having only one well layer. The thicknesses of the barrier layer and the well layer are not particularly limited. The light emitting layer 6 is doped with Si at the barrier layer in this embodiment, but not required to be doped with Si. The content of doped Si is not particularly limited.

The light emitting layer 6 is grown at a temperature of 800° C. under a pressure of 10 kPa, in the same way as in the third buffer layer 4. TMAl, TMGa, TMIn, TESi and $NH_3$ are employed respectively as sources of Al, Ga, In, Si and N for growth of the light emitting layer. $N_2$ gas is employed as a carrier gas for carrying these sources. The supply rate of TESi is set to be 0.0009 L/min (0.9 SCCM) under standard state, only for growth of the barrier layer. The molar ratio (ratio in supply rate) of III-group material is suitably controlled to grow the barrier layer and the well layer of the light emitting layer 6. Since the barrier layer has the same composition as the third buffer layer 5, the barrier layer at the bottom of the light emitting layer 6 can be grown consecutively after the growth of the third buffer layer 5, without interruption.

The p-type nitride semi-conductive layer 7 includes a first p-type semi-conductive layer 7a composed of an Mg-doped p-type AlGaInN layer, a second p-type semi-conductive layer 7b composed of an Mg-doped p-type AlGaInN layer, and a third p-type semi-conductive layer 7c composed of an Mg-doped p-type $In_{0.03}Ga_{0.97}N$ layer. The first p-type semi-conductive layer 7a is formed on the light emitting layer 6. The second p-type semi-conductive layer 7b is formed on the first p-type semi-conductive layer 7a. The third p-type semi-conductive layer 7c is formed on the second p-type semi-conductive layer 7b. The compositions of the first p-type semi-conductive layer 7a and the second first p-type semi-conductive layer 7b are suitably determined such that the first p-type semi-conductive layer 7a has a larger bandgap energy than the second p-type semi-conductive layer 7b. The second p-type semi-conductive layer 7b is set to have a specific composition so as to have the same band-gap energy as that of the barrier layer. The p-type semi-conductive layer 7 are set to have a thickness of 6 nm in the first p-type semi-conductive layer 7a, a thickness of 50 nm in the second p-type semi-conductive layer 7b, and a thickness of 20 nm in the third p-type semi-conductive layer 7c in this embodiment. Thicknesses of the p-type semi-conductive layers are not particularly limited.

Both of the first p-type semi-conductive layer 7a and the second p-type semi-conductive layer 7b in the p-type nitride semi-conductive layer 7 are grown at a temperature of 800° C. under a pressure of 10 kPa. TMAI, TMGa, TMIn, $NH_3$, and biscyclopentadienyl magnesium ($Cp_2Mg$) are employed respectively as sources of Al, Ga, In, N and Mg for growth of the layers. $N_2$ gas is employed as a carrier gas for carrying these sources. Mg is supplied as an impurity for exhibiting p-type conductive property. The third p-type semi-conductive layer 7c is grown basically in almost the same way as in the second p-type semi-conductive layer 7b, but TMAI is not supplied for growth of the third p-type semi-conductive layer 7c. The supply rate of $Cp_2Mg$ is set to be 0.02 L/min (20 SCCM) under standard state, for growth of the first, second, and third p-type semi-conductive layers 7a, 7b, 7c. The molar ratio (ratio in supply rate) of III-group material is suitably controlled to grow the first, second, and third p-type semi-conductive layers 7a, 7b, 7c with predetermined compositions.

Figure 2:
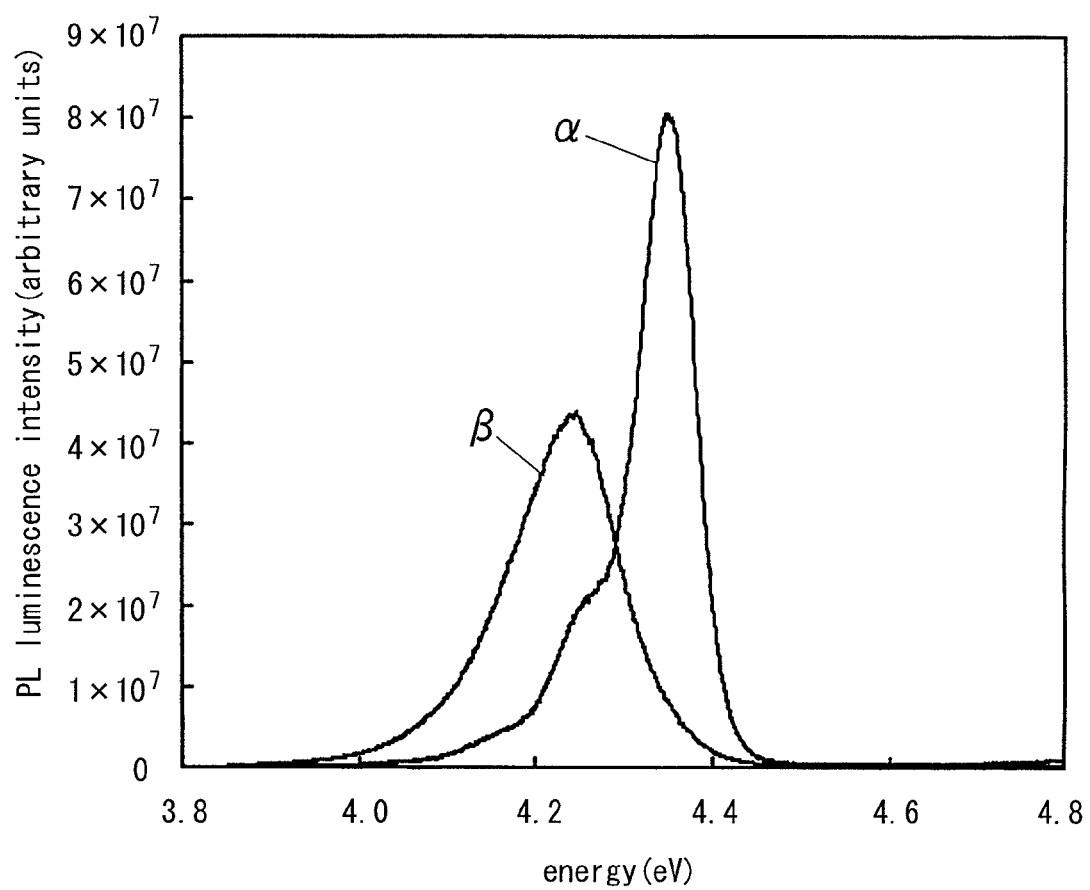
FIG. 2 shows a PL (photoluminescence) spectrum obtained through measurement of photoluminescence of a light emitting layer in the above nitride semi-conductive light emitting device.

Photoluminescence (PL) spectra are obtained for a surface-exposed light emitting layer 6 of the nitride semi-conductive light emitting device in this embodiment, for determination of internal quantum efficiency of the light emitting layer 6. The obtained result is shown in FIG. 2. The PL spectra are measured in 77K (indicated by "a" in FIG. 2) and in ambient temperature (indicated by "P" in FIG. 2). With respect to an area surrounded by the PL spectrum and horizontal axis in FIG. 2, the area ratio of the PL spectrum in 77K to that in ambient temperature is about 1 to 0.85. The light emitting layer 6 in this embodiment is found to enhance the internal quantum efficiency in a deep-ultraviolet range, although it is difficult to enhance the internal quantum efficiency in that range for conventional nitride semi-conductive light emitting devices.

Figure 3:
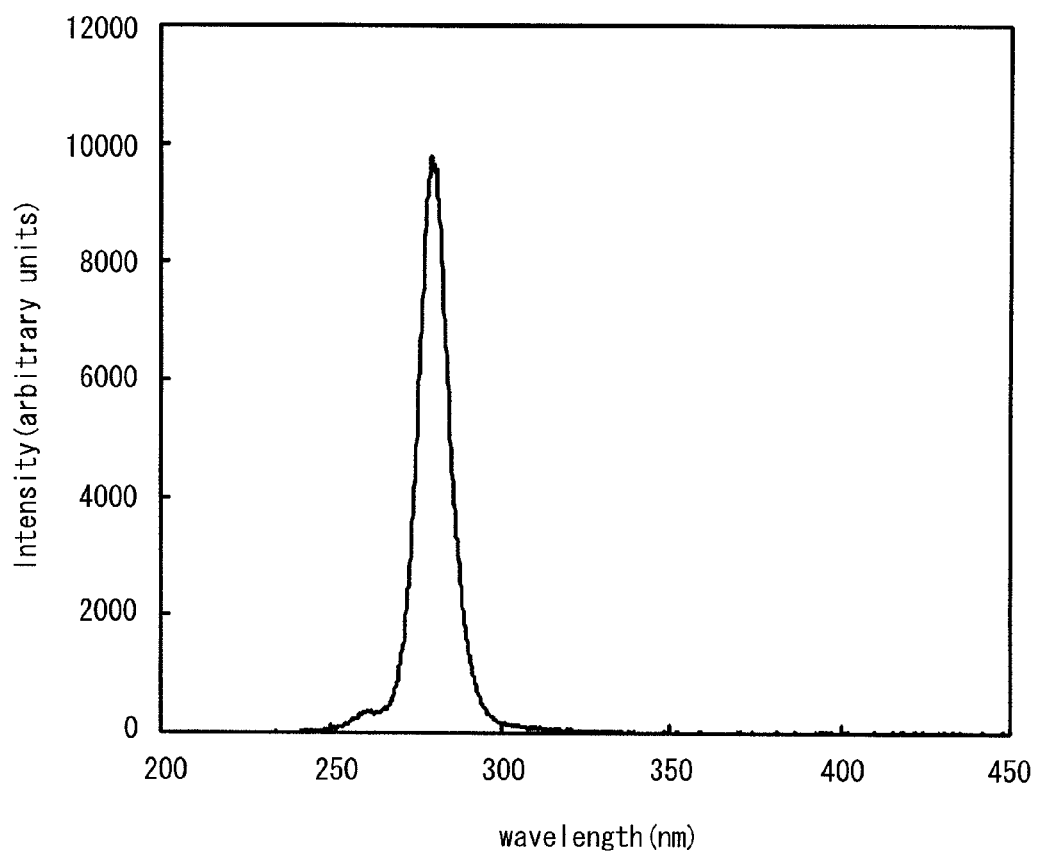
FIG. 3 shows an electric current injection luminescence spectrum of an example of the above nitride semi-conductive light emitting device.

Electric current injection luminescence spectrum is measured for an example of the nitride semi-conductive device having the layers 2-7, which are respectively formed of the above materials and have the above compositions and thicknesses. The obtained result is shown in FIG. 3. The example provided with the Si-doped third buffer layer gives the luminescence spectrum having a peak at ca. 280 nm (in deep-UV region).

Figure 4:
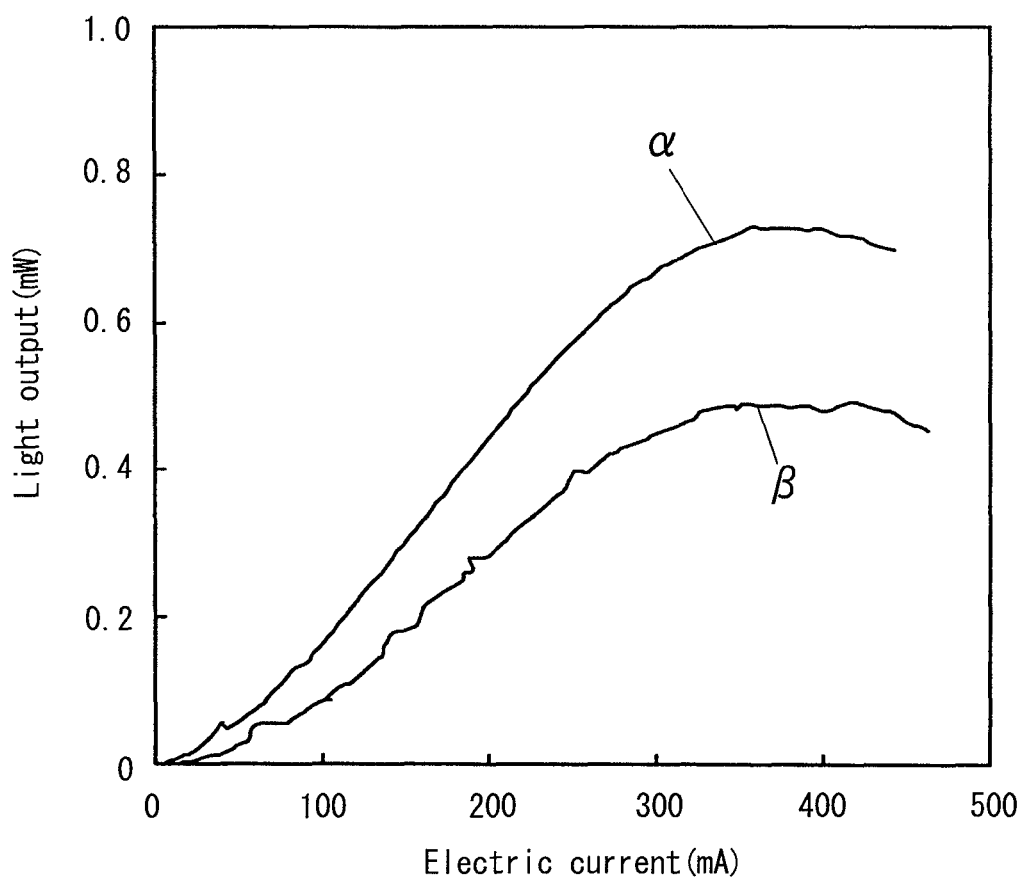
FIG. 4 shows a relationship between an electric current and a light output which is obtained for the above semi-conductive light emitting devices in the example and a comparative example.

In order to confirm the effectiveness of the third buffer layer 5 provided between the second buffer layer 4 and the light emitting layer 6, a sample of comparative example not having the third buffer layer 5 is prepared as well as a sample of the above example having the third buffer layer 5. In preparation of the sample of comparative example, the second buffer layer is set to have a thickness equal to the sum of thicknesses of the second buffer layer 4 and the third buffer layer 5 in this example. The relation between electric current and the light output is obtained through the measurement of electric current injection luminescence spectra for the samples of example and comparative example. The obtained result is shown in FIG. 4. FIG. 4 shows a variation of light output with electric current, which is obtained for the sample of example (indicated by "α") and for the sample of comparative example (indicated by "β"). FIG. 4 demonstrates that the example having the third buffer layer 5 interposed between the second buffer layer 4 and the light emitting layer 6 gives a high light output.

As being provided with the third buffer layer 5 which is doped with the impurity serving as the donor and is provided between the second buffer layer 4 and the light emitting layer 6, the nitride semi-conductive light emitting device in this embodiment enables it to reduce the threading dislocation and residual distortion of the light emitting layer 6, thereby improving crystallinity of the light emitting layer 6 and the internal quantum efficiency. Besides, this nitride semi-conductive light emitting device serves to reduce piezoelectric field in the light emitting layer 6 by exploiting carriers which are generated in the third buffer layer 5, giving an improved internal quantum efficiency of the light emitting layer 6 for achieving an improved light output. Besides, since the impurity in the third buffer layer 5 of this embodiment acts as a donor, this nitride semi-conductive light emitting device enables to supply the light emitting layer 6 with electrons while maintaining the high electrical conductivity.

The impurity doped in the third buffer layer 5 in the nitride semi-conductive light emitting device in this embodiment is Si, thereby improving a planarity of the surface of the third buffer layer 5 serving as a base for growth of the light emitting layer 6, thereby improving quality of the light emitting layer 6 as well as the internal quantum efficiency of the light emitting layer 6. The third buffer layer 5 doped with Si impurity is confirmed to have an improved planarity, by means of AFM (atomic force microscope). When Si is employed as a donor impurity in the n-type nitride semi-conductive layer 3, it is not necessary to additionally prepare a source of Si serving as a donor in the third buffer layer 5 and transfer tubes for transferring the source of Si for a fabricating device (epitaxial growth device) such as MOVPE device, by means of MOVPE or the like in fabrication of the nitride semi-conductive light emitting device in this embodiment, enabling to simplify the fabricating device and reduce a fabrication cost.

In the nitride semi-conductive light emitting device in this embodiment, the third buffer layer 5 has the same components as the second buffer layer 4, thereby being allowed to be grown at the same temperature as in growth of the second buffer layer 4, thereby the third buffer layer 5 to be grown consecutively after the growth of the second buffer layer 4 without interruption needed for modification of growth condition. Accordingly, it is possible to improve an interface between the second buffer layer 4 and the third buffer layer 5 and reduce the fabrication time therefor.

In the nitride semi-conductive light emitting device in this embodiment, since the third buffer layer 5 gives a band-gap energy larger than a photon energy of light emitted from the light emitting layer 6, the light emitted from the light emitting layer 6 is allowed to be radiated outward efficiently without absorbed in the third buffer layer 5.

Second Embodiment

Figure 5:
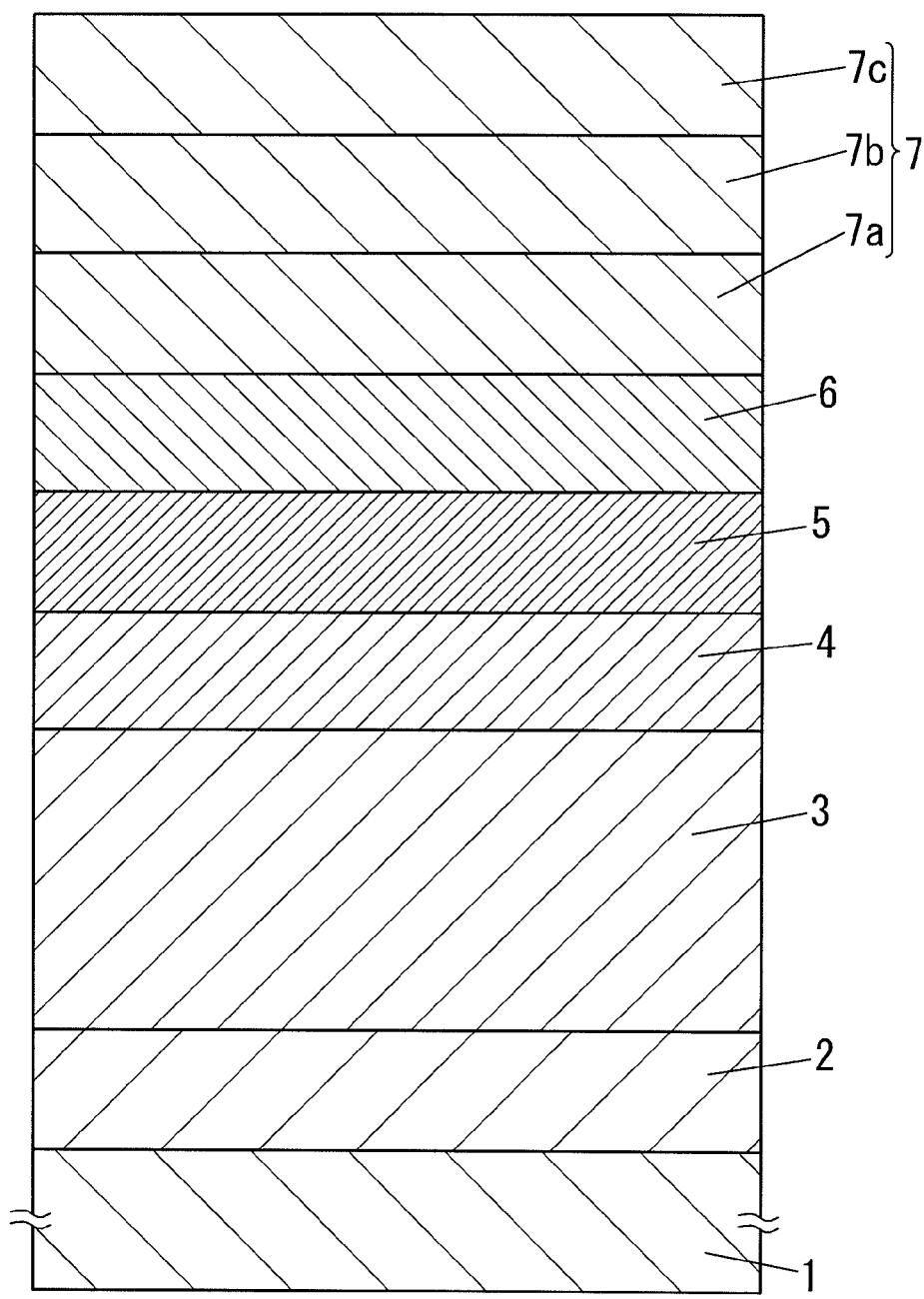
FIG. 5 shows a schematic sectional view of the nitride semi-conductive light emitting device in accordance with second embodiment.

The nitride semi-conductive light emitting device in this embodiment shown in FIG. 5 has almost the same structure as in first embodiment. The nitride semi-conductive light emitting device of this embodiment differs from that of first embodiment, with respect to components and compositions of layers 3-7 other than the single crystal substrate 1 and the first buffer layer 2. Like components as in the first embodiment are indicated by like numerals and duplicate explanations are not given in this embodiment.

The nitride semi-conductive light emitting device in this embodiment comprises the single crystal substrate 1, the first buffer layer 2, the n-type nitride semi-conductive layer 3 formed of an Si-doped n-type $Al_{0.68}Ga_{0.32}N$ layer, the second buffer layer 4 formed of an $Al_{0.64}Ga_{0.36}N$ layer, the third buffer layer 5 formed of an $Al_{0.64}Ga_{0.36}N$ layer doped with Si impurity serving as a donor, the light emitting layer 6 formed of a quantum-well structure of $Al_{0.50}Ga_{0.50}N/Al_{0.64}Ga_{0.36}N$, and the p-type nitride semi-conductive layer 7. The p-type nitride semi-conductive layer 7 includes the first p-type semi-conductive layer 7a, the second p-type semi-conductive layer 7b, and third p-type semi-conductive layer 7c. The first p-type semi-conductive layer 7a is formed on the light emitting layer 6, made of an Mg-doped p-type $Al_{0.80}Ga_{0.20}N$ layer. The second p-type semi-conductive layer 7b is formed on the first p-type semi-conductive layer 7a, and made of an Mg-doped p-type $Al_{0.64}Ga_{0.36}N$ layer. The third p-type semi-conductive layer 7c is formed on the second p-type semi-conductive layer 7b, and made of an Mg-doped p-type GaN layer.

The second buffer layer 4 is controlled to have a thickness of 15 nm and a composition for having a bandgap energy of 4.7 eV. But, the thickness and composition are not particularly limited.

The second buffer layer 4 is grown at 1100° C. under a pressure of 10 kPa. TMAl, TMGa and $NH_3$ are employed respectively as sources of Al, Ga and N for growth of this layer. $H_2$ gas is employed as a carrier gas for carrying these sources.

The third buffer layer 5 is formed of an $Al_{0.64}Ga_{0.36}N$ layer having a thickness of 100 nm, which is doped with Si impurity serving as a donor. Namely, the third buffer layer 5 is formed of the same components as the second buffer layer 4. The composition of the third buffer layer 5 is suitably set to have a large band-gap energy, for not allowing the light emitted from the light emitting layer 6 to be absorbed in the third buffer layer 5. In this embodiment, the third buffer layer 5 is set to have the same composition as the second buffer layer 4. In the present invention, the third buffer layer 5 is not required to have a thickness of 100 nm.

The third buffer layer 5 is grown at a temperature of 1100° C. under a pressure of 10 kPa. TMAl, TMGa, $NH_3$ and TESi are employed respectively as sources of Al, Ga, N and Si for growth of this layer. $H_2$ gas is employed as a carrier gas for carrying these sources. Namely, the third buffer layer 5 is basically grown in almost the same way as in the second buffer layer 4, but TESi as a source gas is additionally supplied for growth of the third buffer layer 5. In this embodiment, the supply rate of TESi is set to be 0.0009 L/min (0.9 SCCM) under standard state.

The light emitting layer 6 includes barrier layers each formed of $Al_{0.64}Ga_{0.36}N$ layer with a thickness of 10 nm and well layers each formed of $Al_{0.50}Ga_{0.50}N$ layer with a thickness of 3 nm. The barrier layer is set to have the same composition as the third buffer layer 5. The well layer is set to have a specific composition for giving a band-gap energy of 4.4 eV. The light emitting layer 6 is multi-quantum well structure having three well layers in which each barrier layer and each well layer are alternately superimposed on each other. The compositions of the well layer and the barrier layer are determined depending on a desired wavelength of emitted light. In the present invention, the light emitting layer is not required to have the specific number of the well layer, and may be formed of a single well structure having only one well layer. In the present invention, the thicknesses of the barrier layer and the well layer are not particularly limited.

The light emitting layer 6 is growth at 1100° C. under a pressure of 10 kPa as in the third buffer layer 4. TMAl, TMGa, and $NH_3$ are respectively employed as sources of Al, Ga and N, for growth of this layer 6. $H_2$ is utilized as a carrier gas for carrying these sources. The barrier layer and the well layer are grown at different supply rates of III-group material. But, the barrier layer and the third buffer layer 5 are set to have the same composition, thereby allowing the bottom of the light emitting layer 6 to be formed consecutively after the formation of the third buffer layer 5 without interruption.

The p-type nitride semi-conductive layer 7 is set to have different compositions at the first p-type semi-conductive layer 7a and the second p-type semi-conductive layer 7b, such that a bandgap energy of the first p-type semi-conductive layer 7a is larger than that of the second p-type semi-conductive layer 7b. The second p-type semi-conductive layer 7b is set to have a composition for having the same bandgap energy as that of the barrier layer. In this embodiment, the p-type nitride semi-conductive layer 7 is set to have a thickness of 20 nm at the first p-type semi-conductive layer 7a, a thickness of 50 nm at the second p-type semi-conductive layer 7b, and a thickness of 20 nm at the third p-type semi-conductive layer 7c. But, in the present invention, the above thicknesses are not particularly limited.

The first p-type semi-conductive layer 7a and the second p-type semi-conductive layer 7b of the p-type nitride semi-conductive layer 7 are grown at 1100° C. under a pressure of 10 kPa. TMAl, TMGa, $NH_3$ and $Cp_2Mg$ are respectively employed as sources of Al, Ga, N, and Mg, which is supplied as a donor for exhibiting p-type conductive property, for growth of these layers. $H_2$ is utilized as a carrier gas for carrying these sources. The third p-type semi-conductive layer 7c is grown in almost the same way as in the second p-type semi-conductive layer 7b. But, TMAl is not supplied for growth of the third p-type semi-conductive layer 7c. $Cp_2Mg$ is supplied at a supply rate of 0.02 L/min (20 SCCM) under standard state for growth of each p-type semi-conductive layer 7a, 7b, 7c.

In the nitride semi-conductive light emitting device in this embodiment, the third buffer layer 5 is doped with an impurity serving as a donor and provided between the second buffer layer 4 and the light emitting layer 6, reducing the threading dislocation and the residual distortion in the light emitting layer 6 as well as improving crystallinity and internal quantum efficiency of the light emitting layer 6. Besides, the piezoelectric field generated in the light emitting layer 6 is suppressed by carriers generated in the third buffer layer 5, for improvement of the internal quantum efficiency and light output of the light emitting layer 6. Besides, the impurity doped in the third buffer layer 5 serves as a donor, thereby enabling to supply the light emitting layer 6 with electrons while keeping high electrical conductivity. In the nitride semi-conductive light emitting device of this embodiment, the impurity doped in the third buffer layer 5 is Si, thereby improving the planarity of the third buffer layer 5 serving as the base for growth of the light emitting layer 6 for promising a high quality of the light emitting layer 6, as well as improving the internal quantum efficiency of the light emitting layer 6.

Third Embodiment

Figure 6:
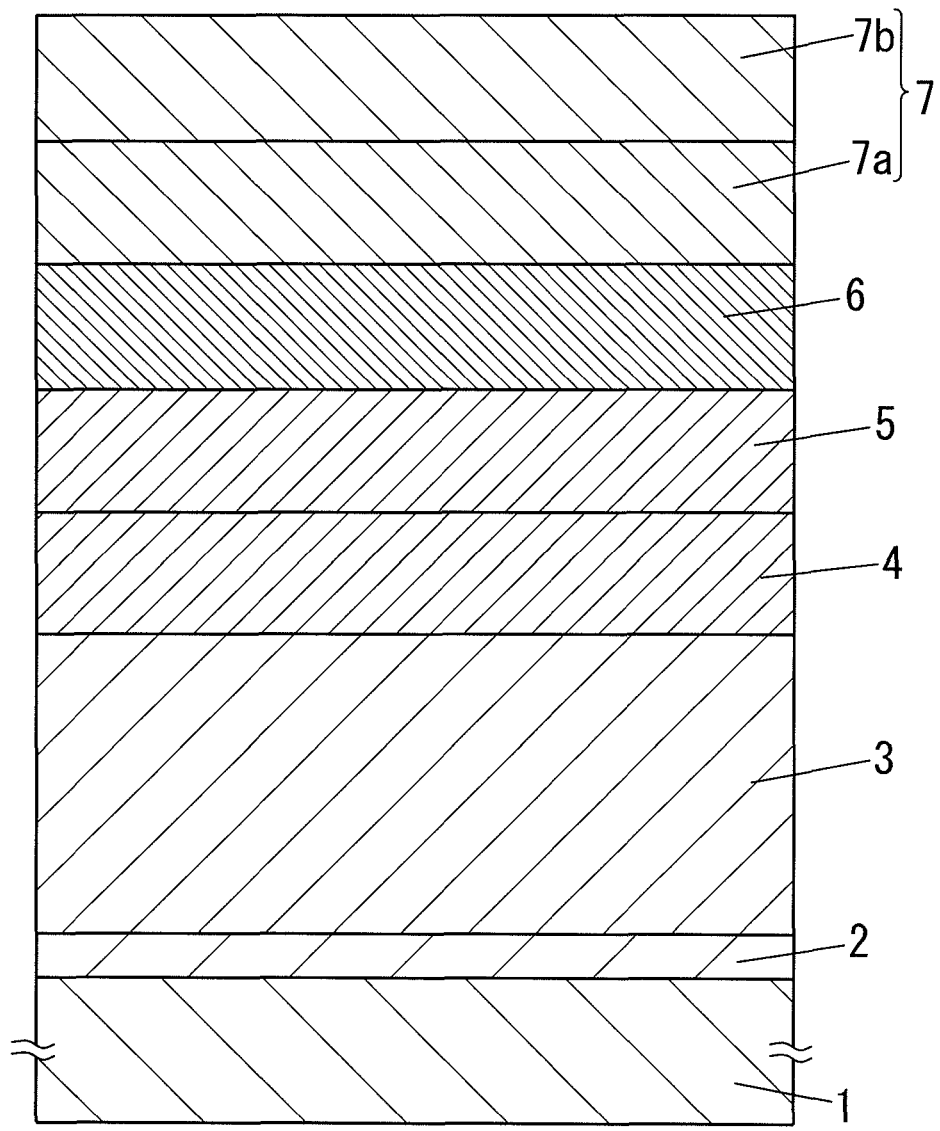
FIG. 6 shows a schematic sectional view of the nitride semi-conductive light emitting device in accordance with third embodiment.

The nitride semi-conductive light emitting device in this embodiment shown in FIG. 6 has almost the same structure as in first embodiment. The nitride semi-conductive light emitting device of this embodiment differs from that of first embodiment, with respect to components and compositions of layers 2-7 other than the single crystal substrate 1. Like components as in the first embodiment are indicated by like numerals and duplicate explanations are not given in this embodiment.

The nitride semi-conductive light emitting device in this embodiment is a visible-light emitting diode and comprises the single crystal substrate 1, the first buffer layer 2 formed of a GaN layer, the n-type nitride semi-conductive layer 3 formed of an Si-doped n-type GaN layer, the second buffer layer 4 formed of an $In_{0.02}Ga_{0.98}N$ layer, the third buffer layer 5 formed of an $In_{0.02}Ga_{0.98}N$ layer doped with Si impurity serving as a donor, the light emitting layer 6 formed of a quantum-well structure of $In_{0.20}Ga_{0.80}N/In_{0.02}Ga_{0.98}N$, and the p-type nitride semi-conductive layer 7. The p-type nitride semi-conductive layer 7 includes the first p-type semi-conductive layer 7a and the second p-type semi-conductive layer 7b. The first p-type semi-conductive layer 7a is provided on the light emitting layer 6 and formed of an Mg-doped p-type $Al_{0.10}Ga_{0.90}N$ layer. The second p-type semi-conductive layer 7b is provided on the first p-type semi-conductive layer 7a, and formed of an Mg-doped p-type GaN layer.

The first buffer layer 2 is provided to reduce the threading dislocation and residual distortion of the n-type nitride semi-conductive layer 3, and formed of a low-temperature GaN buffer layer having a thickness of 25 nm at a low temperature. The thickness of the first buffer layer 2 is not particularly limited to this value.

Prior to formation of the first buffer layer 2, the single crystal substrate 1 made of sapphire substrate is put into the reaction chamber of MOVPE apparatus. Then, the single crystal substrate is heated up to a predetermined temperature (e.g., 1250° C.) and then retained at the temperature for a predetermined time (e.g., 10 minutes) under a predetermined pressure (e.g., 10 kPa≈76 Torr) inside the reaction chamber, so as to be cleaned at its top surface. Next, the reaction chamber is supplied with TMGa and $NH_3$ simultaneously as sources of Ga and N respectively, while the substrate is retained at a lowered temperature of 500° C., in order to grow an amorphous GaN layer on this substrate. At this time, supply rates of TMGa and $NH_3$ are set to be 0.02 L/min (20SCCM) and 2 L/min (2SLM) respectively, under standard state. Next, the substrate is heated up to a predetermined annealing temperature (e.g., 1100° C.) and then retained at this temperature for five minutes for the purpose of annealing the GaN layer, so as to form a polycrystalline GaN layer as the first buffer layer 2. The first buffer layer 2 may be made of an AlGaN layer or an AlN layer instead of the GaN layer.

The n-type nitride semi-conductive layer 3 is formed of an n-type GaN layer which is provided on the first buffer layer 2. The thickness of the n-type nitride semi-conductive layer 3 is set to be 4 μm in this embodiment, but may be other. The n-type nitride semi-conductive layer 3 may have a multilayer structure instead of a single layer structure. For instance, the n-type nitride semi-conductive layer 3 may be composed of an n-type $Al_{0.2}Ga_{0.8}N$ layer formed on the first buffer layer 2, and an n-type GaN layer formed on the n-type $Al_{0.2}Ga_{0.8}N$ layer.

The n-type nitride semi-conductive layer 3 is grown at a temperature of 1100° C. under a pressure of 10 kPa. TMGa, $NH_3$ and TESi are employed respectively as sources of Ga, N and Si, for growth of the n-type nitride semi-conductive layer 3. Si serves as an impurity for giving n-type electrical property. $H_2$ and $N_2$ gases are utilized as carrier gases for carrying these sources. The supply rate of TESi is set to be 0.0009 L/min (0.9 SCCM) under standard state. Other sources can be employed for growth of the n-type nitride semi-conductive layer. For example, TEGa, a hydrazine derivative and $SiH_4$ can be employed respectively as sources of Ga, N and Si.

The second buffer layer 4 is formed of an $In_{0.02}Ga_{0.98}N$ layer having a thickness of 15 nm, and has a composition for having a band-gap energy of 3.2 eV. The thickness and composition are not particularly limited.

The second buffer layer 4 is grown at a temperature of 750° C. under a pressure of 10 kPa. TMGa, TMIn and $NH_3$ are employed respectively as sources of Ga, In and N for growth of this layer. $N_2$ gas is utilized as a carrier gas for carrying these sources.

The third buffer layer 5 is provided for suppressing the threading dislocation and the residual distortion of the light emitting layer 6, as well as serving as a base having an improved planarity for growth of the light emitting layer 6. The third buffer layer 5 also serves to exploit carriers generated therein for suppressing a piezoelectric field in the light emitting layer 6. The third buffer layer 5 is formed of an InGaN layer having a thickness of 100 nm which is doped with Si impurity as a donor. Namely, the third buffer layer 5 has the same components as the second buffer layer 4. The composition of the third buffer layer 5 is suitably controlled to have a large band-gap energy, for not allowing the light emitted from the light emitting layer 6 to be absorbed in the third buffer layer 5. The third buffer layer 5 has the same composition as the second buffer layer 4 in this embodiment. The third buffer layer 5 may be formed to have a thickness except 100 nm.

The third buffer layer 5 is grown at a temperature of 750° C. under a pressure of 10 kPa. TMIn, TMGa, $NH_3$ and TESi are employed respectively as sources of In, Ga, N and Si for growth of this layer. $N_2$ gas is employed as a carrier gas for carrying these sources. Namely, the third buffer layer 5 is basically grown in almost the same way as in the second buffer layer 4, but TESi as a source gas is additionally supplied for growth of the third buffer layer 5. In this embodiment, the supply rate of TESi is set to be 0.0009 L/min (0.9 SCCM) under standard state.

The light emitting layer 6 is composed of barrier layers and well layers. Each barrier layer is formed of an $In_{0.02}Ga_{0.98}N$ layer having a thickness of 10 nm. Each well layer is formed of an $In_{0.20}Ga_{0.80}N$ layer having a thickness of 3 nm. The barrier layer has the same composition as that of the third buffer layer, whereas the well layer has a composition for having a band-gap energy of 2.7 eV. The light emitting layer 6 has a multi-quantum well structure having three well layers in which each well layer and each barrier layer are alternately superimposed on each other. The compositions of the well layer and the barrier layer are not particularly limited, and can be suitably determined in accordance with a desired wavelength of emitted light. The number of well layer is not particularly limited, but may be one. The light emitting layer may be formed of a single quantum-well structure having only one well layer. The thicknesses of the barrier layer and the well layer are not particularly limited.

The light emitting layer 6 is grown at a temperature of 750° C. under a pressure of 10 kPa, as in the third buffer layer 5. TMIn, TMGa and $NH_3$ are employed respectively as sources of In, Ga and N for growth of this layer. $N_2$ gas is employed as a carrier gas for carrying these sources. The molar ratio (ratio in supply rate) of III-group material is suitably controlled to grow the barrier layer and the well layer of the light emitting layer 6. Since the barrier layer has the same composition as the third buffer layer 5, the barrier layer at the bottom of the light emitting layer 6 can be grown consecutively after the growth of the third buffer layer 5, without interruption.

The p-type nitride semi-conductive layer 7 includes the first p-type semi-conductive layer 7a and the second p-type semi-conductive layer 7b. The first p-type semi-conductive layer 7a is provided on the light emitting layer 6, and formed of a p-type $Al_{0.10}Ga_{0.90}N$ layer. The second p-type semi-conductive layer 7b is provided on first p-type semi-conductive layer 7a, and formed of a p-type GaN layer. The compositions of the first p-type semi-conductive layer 7a and the second first p-type semi-conductive layer 7b are suitably determined such that the first p-type semi-conductive layer 7a has a larger bandgap energy than the second p-type semi-conductive layer 7b. The p-type nitride semi-conductive layer 7 are controlled to have a thickness of 20 nm in the first p-type semi-conductive layer 7a, and a thickness of 50 nm in the second p-type semi-conductive layer 7b. Thicknesses of the p-type semi-conductive layers are not particularly limited.

The first p-type semi-conductive layer 7a in the p-type nitride semi-conductive layer 7 is grown at a temperature of 1100° C. under a pressure of 10 kPa. TMAI, TMGa, $NH_3$ and $Cp_2Mg$ are employed respectively as sources of Al, Ga, N and Mg for growth of this layer. Mg serves as an impurity for giving p-type electrical property. $H_2$ gas is employed as a carrier gas for carrying these sources. The second p-type semi-conductive layer 7b is grown basically in almost the same way as in the first p-type semi-conductive layer 7a, but TMAI is not supplied for growth of the second p-type semi-conductive layer 7b. The supply rate of $Cp_2Mg$ is set to be 0.02 L/min (20 SCCM) under standard state, for growth of the first and second p-type semi-conductive layers 7a, 7b.

Since the third buffer layer 5 is doped with the impurity serving as the donor and is provided between the second buffer layer 4 and the light emitting layer 6 as in first embodiment, the nitride semi-conductive light emitting device in this embodiment enables it to reduce the threading dislocation and residual distortion in the light emitting layer 6, thereby improving crystallinity of the light emitting layer 6 with an increased the internal quantum efficiency. Besides, this nitride semi-conductive light emitting device serves to suppress the piezoelectric field in the light emitting layer 6 by exploiting carriers which are generated in the third buffer layer 5, giving an improved internal quantum efficiency of the light emitting layer 6 for achieving high output. Besides, since the impurity in the third buffer layer 5 of this embodiment acts as a donor, this nitride semi-conductive light emitting device enables to supply the light emitting layer 6 with electrons while maintaining the high electrical conductivity. In addition, since the impurity doped in the third buffer layer 5 is Si in the nitride semi-conductive light emitting device of this embodiment, the third buffer layer 5 enables it to improve the planarity of its surface serving as a base for growth of the light emitting layer 6, thereby promising a high quality of the light emitting layer 6 as well as a high internal quantum efficiency of the light emitting layer 6.

Fourth Embodiment

Figure 7:
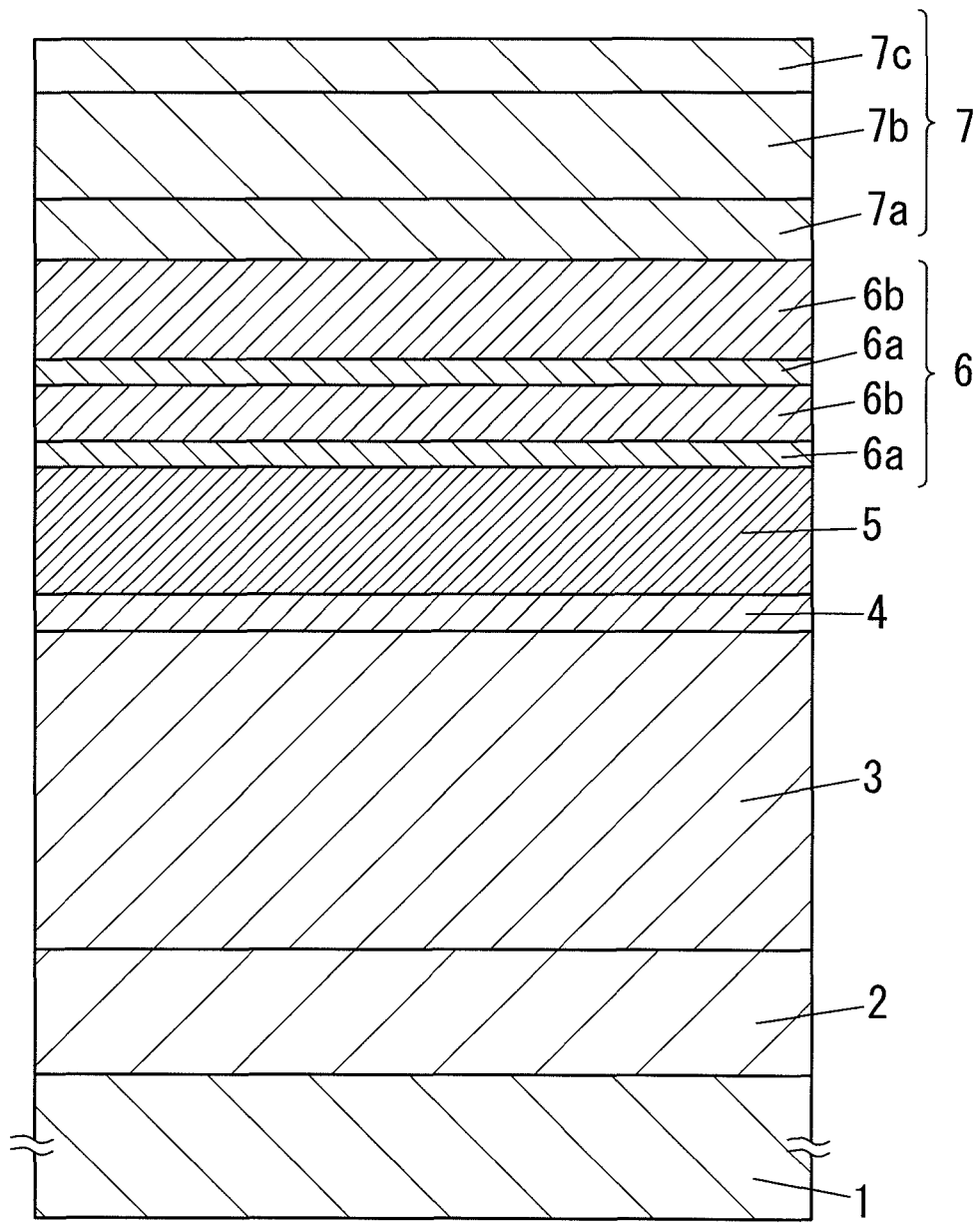
FIG. 7 shows a schematic sectional view of the nitride semi-conductive light emitting device in accordance with fourth embodiment.

The nitride semi-conductive light emitting device in this embodiment shown in FIG. 7 has almost the same structure as in first embodiment. The nitride semi-conductive light emitting device of this embodiment differs from that of first embodiment, with respect to thicknesses of the first buffer layer 2 and the third buffer layer 5, and a structure of the light emitting layer 6 formed on the third buffer layer 5, and thicknesses of the first, second and third p-type semi-conductive layers 7a-7c. Like components as in the first embodiment are indicated by like numerals and duplicate explanations are not given in this embodiment.

In this embodiment, the first buffer layer 2 made of a crystalline AlN layer is controlled to have a thickness of 2.5 nm. The third buffer layer 5 is formed of an Si-doped n-type AlGaInN layer having a thickness of 18 nm, and doped with Si impurity serving as a donor. But, the thicknesses of these layers are not particularly limited.

The light emitting layer 6 is formed of an AlGaInN quantum well structure having two well layers 6a in which each well layer 6a and each barrier layer 6b are alternately superimposed on each other. The light emitting layer 6 has a multi-quantum well structure in this embodiment, but may have a single-quantum well structure. Each of the well layers 6a is formed of an AlGaInN layer having a thickness of 1.7 nm. The barrier layer 6b provided between the well layers 6a, 6a is formed of an Si-doped n-type AlGaInN layer having a thickness of 7 nm. The barrier layer 6b provided between the well layer 6a and the p-type nitride semi-conductive layer 7 is formed of an Si-doped n-type AlGaInN layer having a thickness of 14 nm (twice as much as thickness of the barrier layer 6b provided between the well layers 6a, 6a). The barrier layer 6b is set to have a composition for having a band-gap energy of 4.7 eV as the third buffer layer. The well layer is set to have a composition for having a band-gap energy of 4.4 eV. The compositions of the well layer 6a and the barrier layer 6b are determined in accordance with a desired wavelength of emitted light. The number of the well layer 6a is not particularly limited, and may be one. For example, the light emitting layer may be formed of a single-quantum well structure having one well layer 6a. Thicknesses of the well layer 6a and the barrier layer 6b are not particularly limited. The light emitting layer 6 is doped with Si in the barrier layer, but is not required to be doped with Si. The content of doped Si is not particularly limited.

The p-type nitride semi-conductive layer 7 has a thicknesses of 15 nm in the first p-type semi-conductive layer 7a formed of a p-type AlGaInN layer, a thickness of 55 nm in the second p-type semi-conductive layer 7b formed of a p-type AlGaInN layer, and a thickness of 15 nm in the third p-type semi-conductive layer 7c formed of a p-type $In_{0.03}Ga_{0.97}N$ layer. The present invention is not limited to the above thicknesses.

Figure 8:
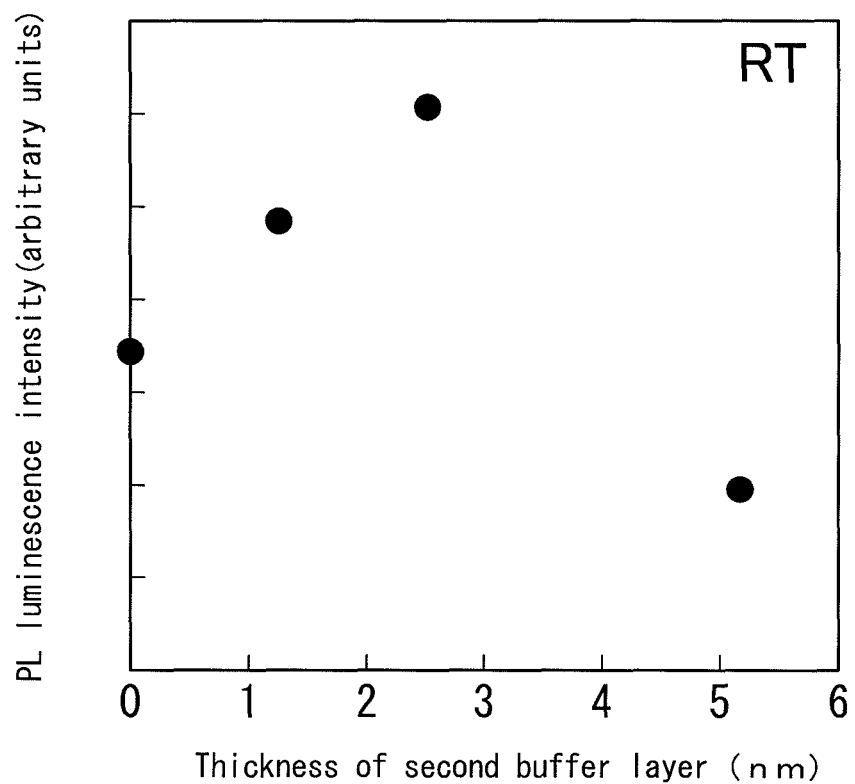
FIG. 8 shows a relationship between thickness of a second buffer layer and intensity of PL spectrum.

In order to confirm the effectiveness of the second buffer layer 4, PL spectra are measured at room temperature (RT) for various samples of nitride semi-conductive light emitting devices having different thicknesses of the second buffer layer 2 in which the light emitting layer 6 is exposed at its surface. The obtained result is shown in FIG. 8. PL intensity is caused to increase by the provided second buffer layer 2. In particular, the sample having a thickness of 2.5 nm in the second buffer layer 4 exhibits a large intensity of photoluminescence. However, the sample having a thickness above 5 nm in the second buffer layer exhibits a decreased PL intensity, which is presumably due to a poor planarity of the second buffer layer 4 having too large thickness.

Figure 9:
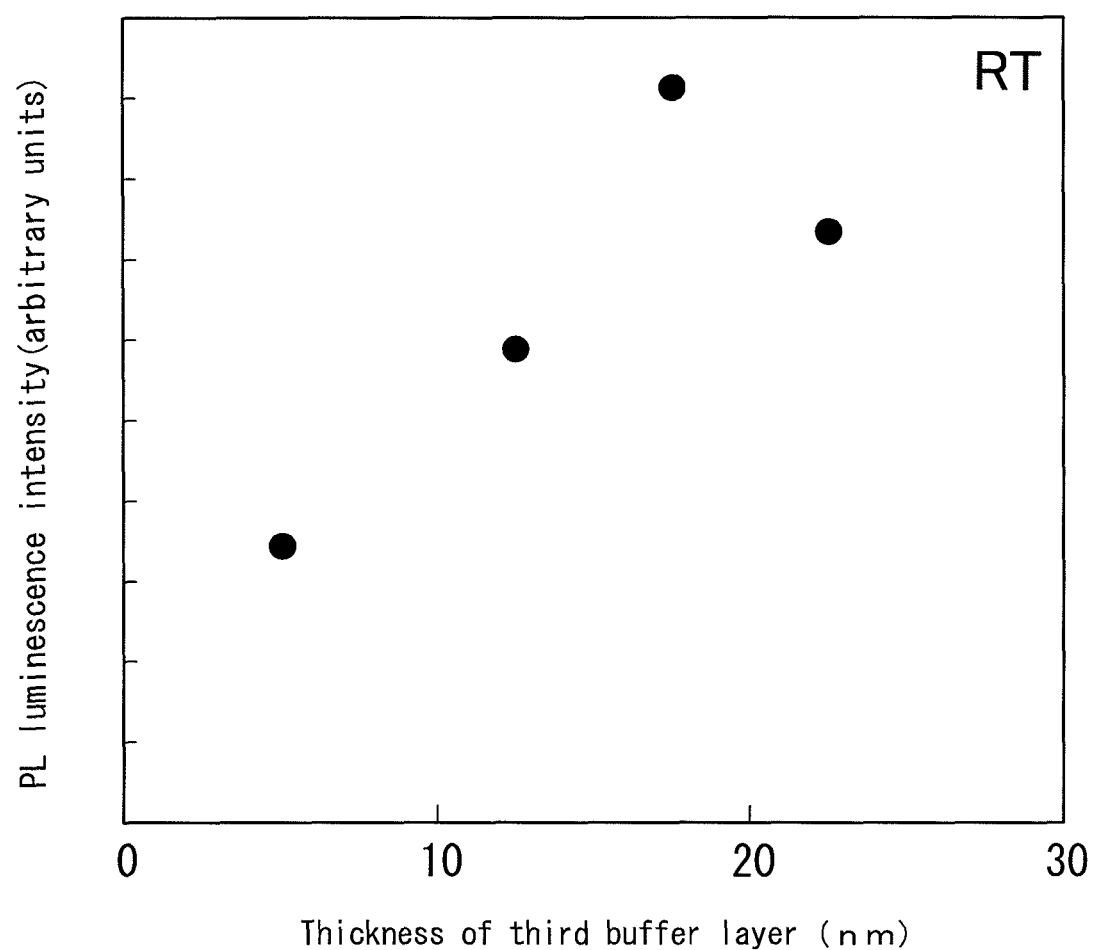
FIG. 9 shows a relationship between thickness of a third buffer layer and intensity of PL spectrum.

In order to confirm the effectiveness of the third buffer layer 5, PL spectra are measured at room temperature (RT) for various samples having different thicknesses of the third buffer layer 5 in which the light emitting layer 6 is exposed at its surface. The obtained result is shown in FIG. 9. Three samples each having a thickness of the third buffer layer 5 significantly larger than that of the second buffer layer 4 (3 nm) are revealed to give larger luminescence intensities, compared to the sample having a thickness of the third buffer layer 5 (5 nm) slightly larger than that of the second buffer layer 4. The sample having a thickness of 17.5 nm of the third buffer layer 5 exhibits the largest luminescence intensity among the three samples. The samples are found to exhibit increased intensity of PL spectrum when the third buffer layer 5 has a thickness larger than the second buffer layer 4. But, the sample having a thickness of 22.5 nm in the third buffer layer 5 gives a smaller intensity of PL spectrum, than the sample having a thickness of 17.5 nm in the third buffer layer 5. This is presumably caused by decrease in volume of the light emitting layer 6 resulting from defects having V-shape (referred to as V-shaped defect, hereafter), which are developed due to growth of thicknesses of the third buffer layer 5 made of a Si-doped n-type AlGaInN layer, that of each of the well layer 6a of the light emitting layer 6 made of an AlGaInN layer, and that of the barrier layer 6b of the light emitting layer 6 made of an Si-doped n-type AlGaInN layer, in view of the fact that the nitride semi-conductive including In is likely to suffer from the V-shaped defects due to the threading dislocation.

Figure 10:
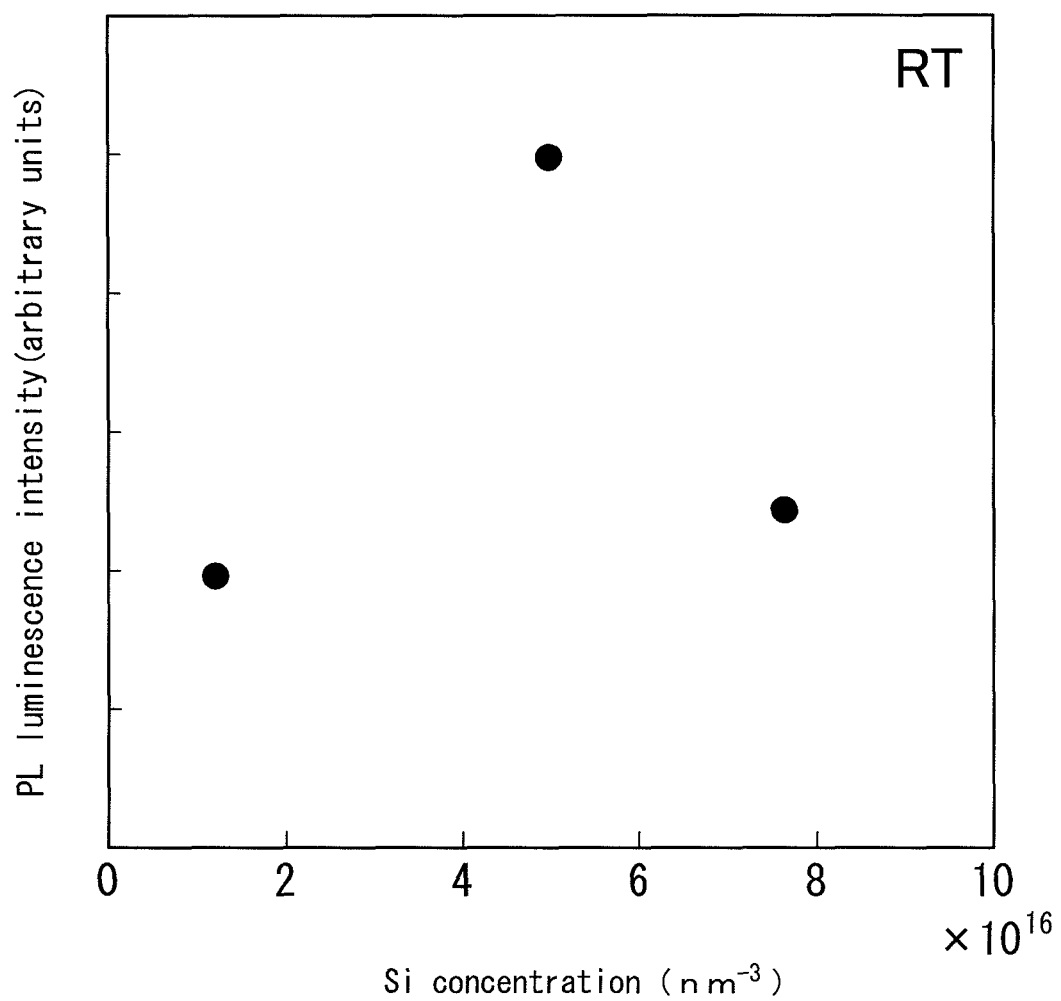
FIG. 10 shows a variation in intensity of PL spectrum with Si concentration in each of the third buffer layer and a barrier layer, which is obtained for the above nitride semi-conductive light emitting device.

In order to confirm the effectiveness of Si doped as a donor, PL spectra in room temperature (RT) are obtained for various samples having different Si concentrations in each of the third buffer layer 5 and the barrier layer 6b, in which the n-type nitride semi-conductive layer 3 has an Si concentration of $1 \times 10^{18}$ cm$^{-3}$ and the light emitting layer 6 is exposed at its surface. The obtained result is shown in FIG. 10. FIG. 10 demonstrates that a large luminescence intensity PL spectrum is obtained for the sample having Si concentration of $5 \times 10^{16}$ cm$^{-3}$ both in the third buffer layer 5 and the barrier layer 6b.

Figure 11:
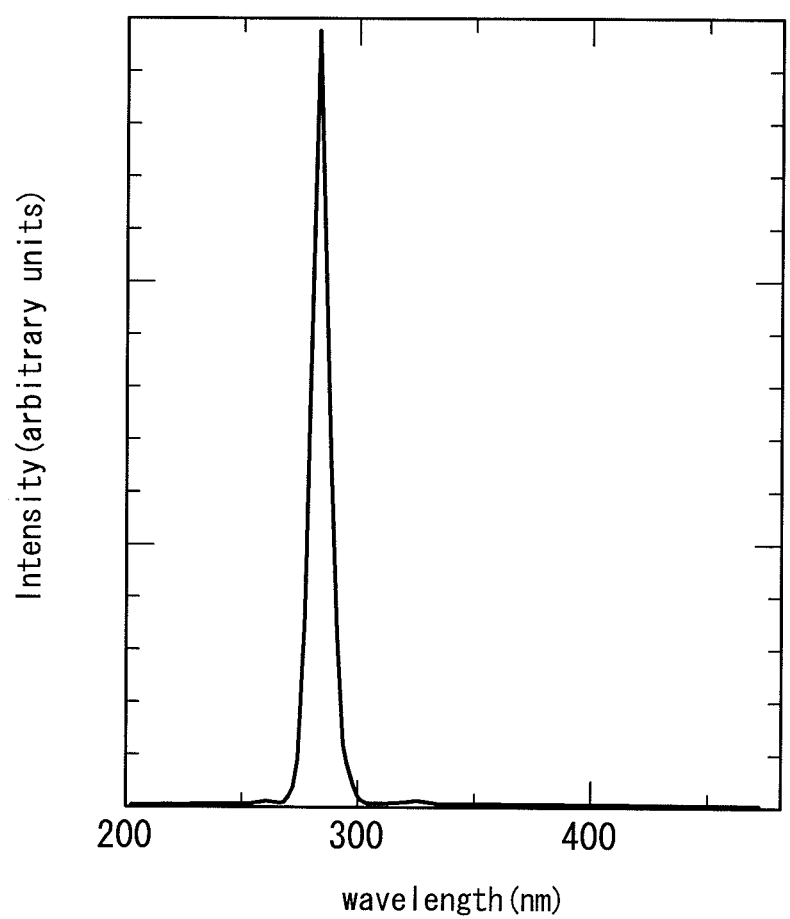
FIG. 11 shows an electric current injection luminescence spectrum obtained for the example of the above nitride semi-conductive light emitting device.
Figure 12:
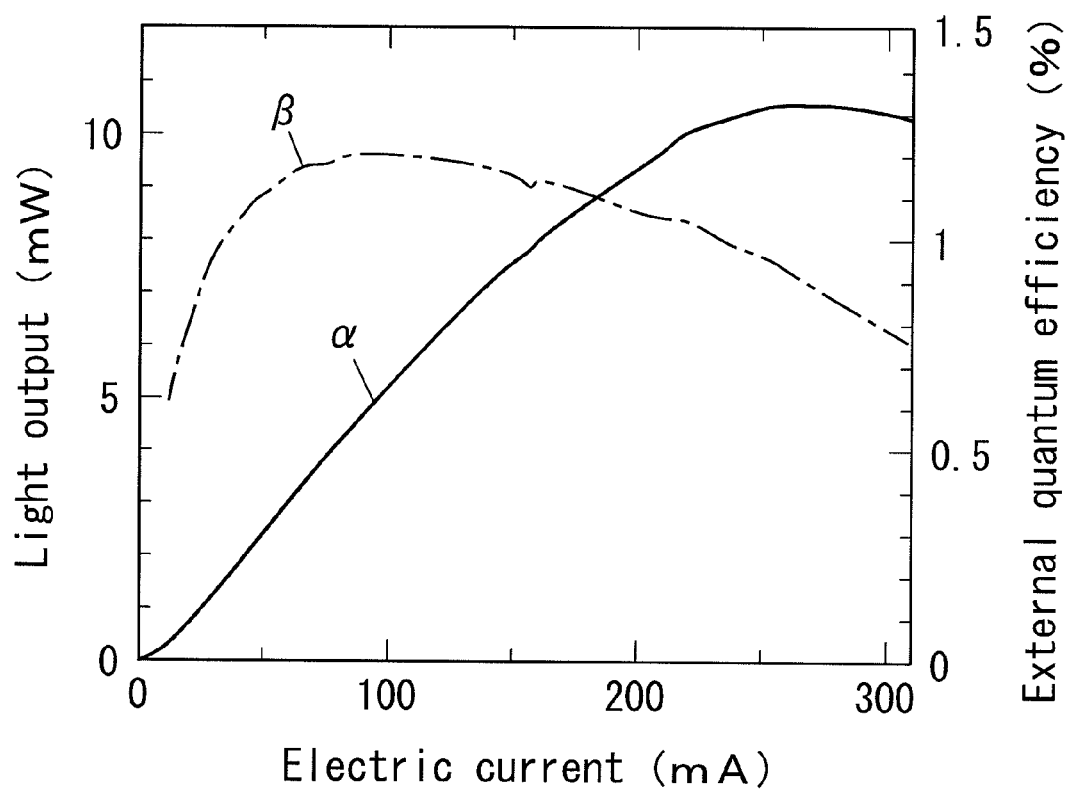
FIG. 12 shows variations in light output and external quantum efficiency with electric current in the example of the above nitride semi-conductive light emitting layer.

FIG. 11 shows an electric current injection luminescence spectrum, which is obtained for the example of the nitride semi-conductive light emitting device having the layers 2 to 7, which are respectively formed of the above materials and have the above compositions and thicknesses. FIG. 12 shows variations in the light output and the external quantum efficiency with the electric current, which are obtained from the measurement of electric current injection luminescence spectrum in room temperature (RT) for the same example of the nitride semi-conductive light emitting device.

As shown in FIG. 11, the nitride semi-conductive light emitting device in this example is provided with the Si-doped third buffer layer, giving a peak of light emission at ca. 282 nm (in deep-UV region). FIG. 12 shows a relation between the electric current and the light output (indicated by "α") and the relation between the electric current and the external quantum efficiency (indicated by "β") in nitride semi-conductive light emitting device of this example. The light output obtained has a maximum of 10.6 mW. The external quantum efficiency obtained has a maximum of 1.2%.

The third buffer layer 5 doped with the impurity serving as a donor is provided between the second buffer layer 4 and the light emitting layer 6 as in first embodiment of the nitride semi-conductive light emitting device, reducing the threading dislocation and the residual distortion as well as improving the crystallinity and the internal quantum efficiency of the light emitting layer 6. Besides, this nitride semi-conductive light emitting device enables to suppress the piezoelectric field in the light emitting layer 6 by utilizing the carrier generated in the third buffer layer 5, improving the internal quantum efficiency of the light emitting layer 6 for achieving high output. Besides, this nitride semi-conductive light emitting device allows the light emitting layer 6 to be supplied with electrons while keeping high conductivity, since the impurity doped in the third buffer layer serves as a donor.

In the nitride semi-conductive light emitting device of this embodiment, the third buffer layer 5 has a thickness (e.g., 18 nm) larger than the second buffer layer 4 (e.g., 3 nm), whereby improving the planarity of the third buffer layer 5 acting as a base for growth of the light emitting layer 6.

In the nitride semi-conductive light emitting device of this embodiment, the third buffer layer 5 has a donor concentration lower than the n-type nitride semi-conductive layer 3, enabling it to reduce defects in the crystal of the third buffer layer 5 acting as the base for growth of the light emitting layer 6 as well as improving the internal quantum efficiency of the light emitting layer 6.

In the nitride semi-conductive light emitting device of this embodiment, the light emitting layer 6 has a quantum well structure in which the barrier layer 6b adjacent to the well layer 6a is doped with an impurity serving as a donor. Besides, the piezoelectric field in the light emitting layer 6 having quantum well structure can be efficiently reduced with the help of the carrier generated in the barrier layer 6b.

The light emitting layer 6 has a multi-quantum well structure or a single-quantum well structure in the above embodiments, but may be formed of a single layer structure. In this case, the light emitting layer 6 made of single layer structure serves to form a double-hetero structure together with adjacent layers (i.e., the third buffer layer 5 and the first p-type semi-conductive layer 7a of the p-type nitride semi-conductive layer 7). Besides, the technical concept of the present invention can be widely applied to various structures by utilizing the above-mentioned structures in the above embodiments.

The nitride semi-conductive light emitting device is fabricated by means of the MOVPE method in the above embodiments, but not required to be fabricated by the MOVPE method. The nitride semi-conductive light emitting device may be fabricated in other ways such as a hydride vapor phase epitaxy method (an HVPE method), a molecular-beam epitaxy method (an MBE method), and the like.

The single crystal substrate/for fabrication of the nitride semi-conductive light emitting device is formed of the sapphire substrate in the above embodiments, but not required to be formed of the sapphire substrate. The single crystal substrate 1 may be formed of a spinel substrate, a silicon substrate, a silicon carbide substrate, a zinc oxide substrate, a gallium phosphate substrate, a gallium arsenide substrate, a magnesium oxide substrate, a zirconium borate substrate, a III-group nitride semi-conductive crystal substrate, or the like, instead of the sapphire substrate.

The invention claimed is:

1. A nitride semi-conductive light emitting device comprising;
   a single crystal substrate;
   a first buffer layer laminated to a top side of said single crystal substrate;
   an n-type nitride semi-conductive layer laminated to a top side of said first buffer layer;
   a second buffer layer laminated to a top side of said n-type nitride semi-conductive layer;
   a light emitting layer laminated to a top side of said second buffer layer;
   a p-type nitride semi-conductive layer laminated to a top side of said light emitting layer; wherein
   said nitride semi-conductive light emitting device further comprises a third buffer layer provided, between said second buffer layer and said light emitting layer, said third buffer layer being doped with an impurity serving as a donor,
   wherein said third buffer layer has the same components as said second buffer layer, and
   wherein concentration of said donor in said third buffer layer is in the range of $1 \times 10^{16}$ to $7.5 \times 10^{16}$ cm$^{-3}$.

2. The nitride semi-conductive light emitting device as set forth in claim 1, wherein said impurity is Si.

3. The nitride semi-conductive light emitting device as set forth in claim 1, wherein said third buffer layer has a band-gap energy larger than a photon energy of light emitted from said light emitting layer.

4. The nitride semi-conductive light emitting device as set forth in claim 1, wherein said third buffer layer has a thickness larger than said second buffer layer.

5. The nitride semi-conductive light emitting device as set forth in claim 1, wherein said donor, which said third buffer layer has, is lower concentration than said n-type nitride semi-conductive layer.

6. The nitride semi-conductive light emitting device as set forth in claim 1, wherein said light emitting layer has a quantum-well structure containing a barrier layer, said barrier layer being doped with said impurity serving as a donor.

7. The nitride semi-conductive light emitting device as set forth in claim 1, wherein said light emitting layer is formed of an AlGaInN layer or an AlGaN layer.

8. The nitride semi-conductive light emitting device as set forth in claim 1, wherein said nitride semi-conductive light emitting device is an ultraviolet light emitting diode.

9. A process of fabricating nitride semi-conductive emitting device comprising steps of;
    disposing a single crystal substrate within a reaction chamber;
    forming a first buffer layer on a top side of said single crystal substrate;
    forming an n-type nitride semi-conductive layer on a top side of said first buffer layer;
    forming a second buffer layer on a top side of said n-type nitride semi-conductive layer;
    forming a third buffer layer on a top side of said second buffer layer;
    forming a light emitting layer on a top side of said third buffer layer;
    forming a p-type nitride semi-conductive layer on a top side of said light emitting layer;
    wherein said third buffer layer is formed by supplying the same source gas used in forming said second but layer and a source gas of an impurity serving as a donor to said reaction chamber, and
    wherein said third buffer layer is formed so that concentration of said donor in said third buffer layer is in the range of $1\times10^{16}$ to $7.5\times10^{16}$ cm$^{-3}$.

10. The process of fabricating nitride semi-conductive light emitting device as set forth in claim 9, wherein said impurity is Si.

11. The process of fabricating nitride semi-conductive light emitting device as set forth in claim 9, wherein
    said third butter layer is formed to have a band-gap energy larger than a photon energy of light emitted from said light emitting layer.

12. The process of fabricating nitride semi-conductive light emitting device as set forth in claim 9, wherein
    said third buffer layer is formed to have a thickness larger than said second buffer layer.

13. The process of fabricating nitride semi-conductive light emitting device as set forth in claim 9, wherein
    said third buffer layer is formed so that said donor, which said third buffer layer has, is lower concentration than said n-type nitride semi-conductive layer.

14. The process of fabricating nitride semi-conductive light emitting device as set forth in claim 9, wherein
    said light emitting layer is formed to have a quantum well structure with a harrier layer, and wherein
    said source gas of said impurity is supplied to said reaction chamber to form said barrier layer of said light emitting layer.

* * * * *

UNITED STATES PATENT AND TRADEMARK OFFICE
CERTIFICATE OF CORRECTION

PATENT NO. : 8,445,938 B2
APPLICATION NO. : 12/933927
DATED : May 21, 2013
INVENTOR(S) : Takayoshi Takano et al.

It is certified that error appears in the above-identified patent and that said Letters Patent is hereby corrected as shown below:

Title Page, Item (73) Assignee please change "Panasonic Corporation, Osaka (JP)" to
-- PANASONIC CORPORATION, Osaka JP and RIKEN, Saitama (JP) --.

Signed and Sealed this
Eighth Day of October, 2013

Teresa Stanek Rea
*Deputy Director of the United States Patent and Trademark Office*